United States Patent
Odegard et al.

(10) Patent No.: US 7,393,719 B2
(45) Date of Patent: Jul. 1, 2008

(54) INCREASED STAND-OFF HEIGHT INTEGRATED CIRCUIT ASSEMBLIES, SYSTEMS, AND METHODS

(75) Inventors: Charles Anthony Odegard, McKinney, TX (US); Tz-Cheng Chiu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 349 days.

(21) Appl. No.: 11/109,258

(22) Filed: Apr. 19, 2005

(65) Prior Publication Data

US 2006/0234490 A1 Oct. 19, 2006

(51) Int. Cl.
*H01L 21/50* (2006.01)
*H01L 21/48* (2006.01)
*H01L 21/44* (2006.01)
*H01L 23/52* (2006.01)
*H01L 23/48* (2006.01)
*H01L 23/40* (2006.01)
*H01L 23/485* (2006.01)
*H01L 23/488* (2006.01)

(52) U.S. Cl. .......... 438/108; 438/613; 438/612; 257/780; 257/778; 257/779; 257/738; 257/E23.021; 257/E23.023

(58) Field of Classification Search ............... 438/108, 438/612, 613; 257/738, 778, 779, 780, E23.021, 257/E23.023
See application file for complete search history.

(56) References Cited

U.S. PATENT DOCUMENTS

| | | | | | |
|---|---|---|---|---|---|
| 6,081,997 | A | * | 7/2000 | Chia et al. | 29/841 |
| 6,131,795 | A | * | 10/2000 | Sato | 228/102 |
| 6,220,503 | B1 | * | 4/2001 | Cox et al. | 228/265 |
| 6,324,069 | B1 | * | 11/2001 | Weber | 361/783 |
| 6,451,625 | B1 | * | 9/2002 | Pu et al. | 438/108 |
| 6,643,434 | B2 | * | 11/2003 | Cayrefourcq et al. | 385/52 |
| 6,965,552 | B2 | * | 11/2005 | Tokuda et al. | 369/121 |
| 2004/0232561 | A1 | * | 11/2004 | Odegard | 257/778 |

* cited by examiner

*Primary Examiner*—Luan Thai
(74) *Attorney, Agent, or Firm*—Yingsheng Tung; Wade James Brady, III; Frederick J. Telecky, Jr.

(57) ABSTRACT

Disclosed are integrated circuit assemblies with increased stand-off height and methods and systems for their manufacture. Methods of the invention provide for assembling a semiconductor device by aligning a die with a substrate and interposing solder between corresponding substrate and die bond pads. A lifting force is applied to the die during heating of the solder to a liquescent state, thereby increasing the stand-off height of the die above the substrate. The lifting force is maintained during cooling of the solder to a solid state, thereby forming increased stand-off height solder connections.

6 Claims, 2 Drawing Sheets

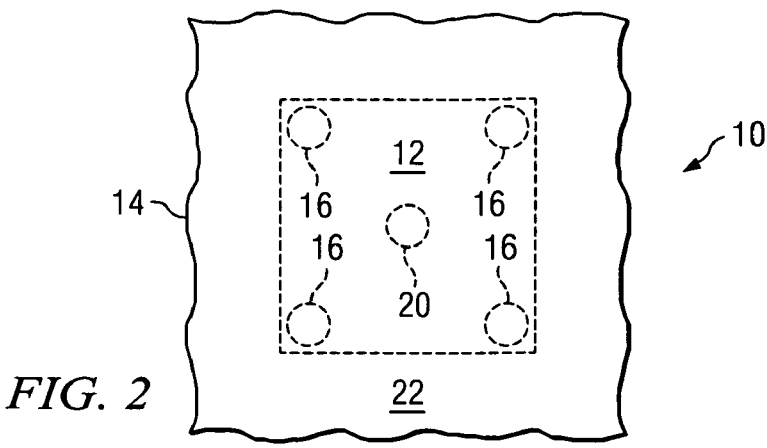
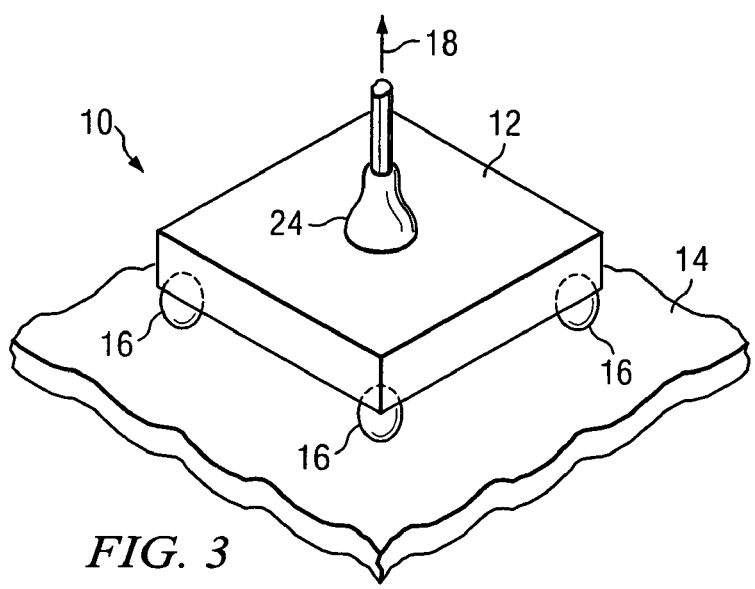
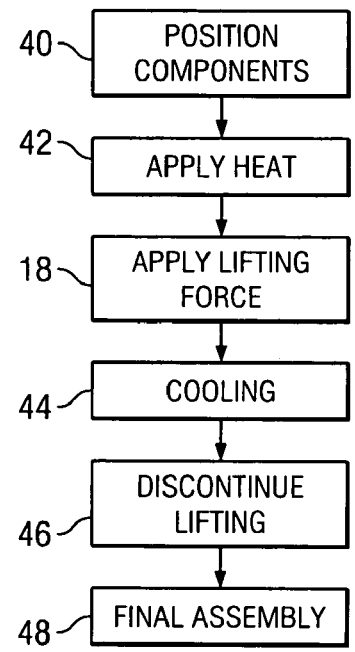
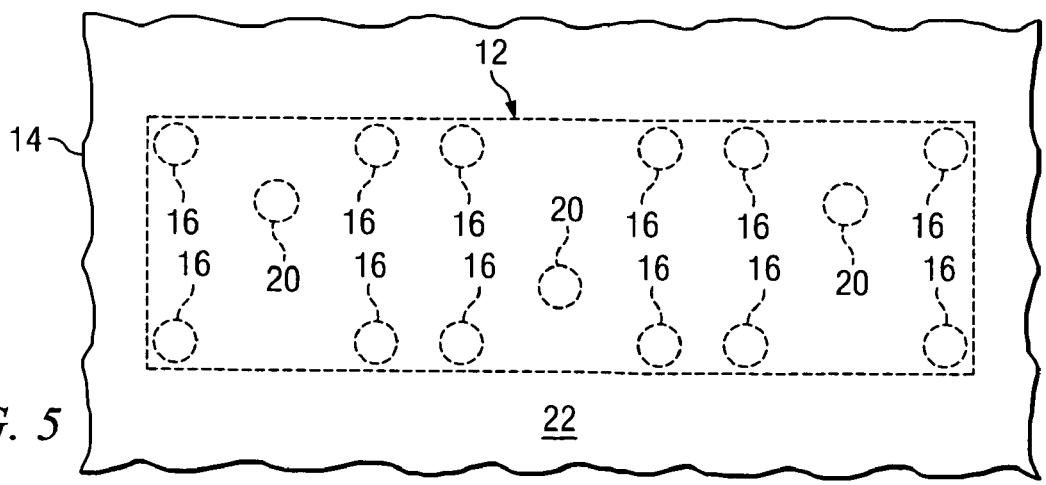

INCREASED STAND-OFF HEIGHT INTEGRATED CIRCUIT ASSEMBLIES, SYSTEMS, AND METHODS

TECHNICAL FIELD

The invention relates to the manufacture of integrated circuit assemblies. More particularly, the invention relates to the coupling of IC devices to a substrate and making solder connections between corresponding metallized locations on the IC device and substrate.

BACKGROUND OF THE INVENTION

Semiconductor devices are subject to many competing design goals. Since it is very often desirable to minimize the size of electronic apparatus, surface mount semiconductor devices are often used due to their small footprint. Solder nodules or "bumps" having spherical, near-spherical, or other shapes are frequently used to join an IC to a substrate, such as a printed circuit board (PCB). The IC and substrate have corresponding metallized locations generally known as contact points, or bond pads. The components are aligned, typically using sophisticated optical aligning tools. Solder bumps positioned at the prepared metallized locations are heated, and solder bonds are formed between the contact points upon cooling. When completed, the IC-to-substrate assembly solder joints are typically "blind," that is, they are not readily accessible for visual inspection. The soldered IC and substrate are then encapsulated in a protective plastic package in order to complete the IC assembly. Often, underfill material is interposed between the IC and substrate as well, in order to provide increased strength and protection.

Among the problems encountered with packaged IC assemblies, some of the most common and debilitating are the separation of layers, and open or short circuits caused by poor solder connections, or subsequent separation of materials, or the ingress of moisture between separated materials. For these reasons, secure solder bonds and void-free underfill and encapsulant materials are highly desirable. The size of the solder bumps used in the formation of solder bonds is generally determined by area considerations, which often include the need for numerous solder joints in close proximity. Small solder bumps are the result. As a side effect of reduced solder bump size, stand-off height, the vertical distance between IC and substrate, can also be reduced. Stand-off height is commonly limited to solder bump height, or less, due to the partial collapse of the solder during reflow. Reductions in the stand-off height can create problems related to soldering, packaging, and reliability in general. Reduced stand-off height between the die and substrate can result in increased stress among dielectric layers of the IC assembly. A reduction in stand-off height also increases the difficulty of making void-free underfills. These and other problems can lead to reduced reliability in the packaged IC assembly.

Due to these and other problems, improved integrated circuit assemblies with increased stand-off height, and methods for their manufacture, would be useful and advantageous in the arts.

SUMMARY OF THE INVENTION

In carrying out the principles of the present invention, in accordance with preferred embodiments thereof, IC assemblies are provided with a stand-off height greater than the starting solder bump height.

According to an aspect of the invention, methods of assembling a semiconductor device with increased stand-off height include steps for positioning a semiconductor die in a position for attachment to a substrate, each having multiple corresponding bond pads. Solder is interposed between the corresponding bond pads and heated. The application of a lifting force while the solder is heated to a liquescent state and during cooling of the solder to a solid state forms increased stand-off height solder connections between the die and substrate.

According to another aspect of the invention, a method of assembling a semiconductor device includes applying a lifting force to the die by pushing up on the lower surface of the die from below.

According to still another aspect of the invention, a method of assembling a semiconductor device according to claim 1 includes the step of providing at least one aperture in the substrate for the communication of a lifting force to the die from below.

According to yet another aspect of the invention, a method of assembling a semiconductor device includes applying a lifting force to the die by pulling up on the die from above.

According to another aspect of the invention, a method of assembling an increased-standoff height semiconductor device includes a further step of dispensing underfill material between the die and substrate.

According to another aspect of the invention, an integrated circuit assembly embodying the invention has a substrate with numerous solder pads adjacent to and aligned with a semiconductor die with corresponding solder pads. Solder bonds between corresponding substrate bond pads and die bond pads have a vertical dimension greater than the horizontal dimension of the solder bonds, thereby providing an integrated circuit assembly having increased stand-off height.

According to yet another aspect of the invention, a system for the manufacture of an increased stand-off height integrated circuit assembly includes means for aligning a surface mountable die with a substrate and means for interposing solder bumps between the die and substrate. Means are also provided for heating the solder bumps to liquescence and applying a separating force to increase the stand-off height between the die and the substrate during solder bump liquescence and subsequent hardening, thereby forming increased stand-off height solder joints between the die and substrate of the integrated circuit assembly.

The invention has advantages including but not limited to providing increased stand-off height in IC assemblies with improved resistance to stress, improved solder interconnect properties, and improved underfill properties. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which:

FIG. 2 is a bottom view of an example of an embodiment of an IC assembly as shown in FIG. 1C;

FIG. 3 is a top perspective view of an example of an alternative embodiment of a method and assembly according to the invention;

FIG. 4 is a simplified process flow diagram depicting an example of a preferred method of the invention; and FIG. 5 is a bottom view of an example of an alternative embodiment of an IC assembly according to the invention.

References in the detailed description correspond to like references in the various drawings unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1A:
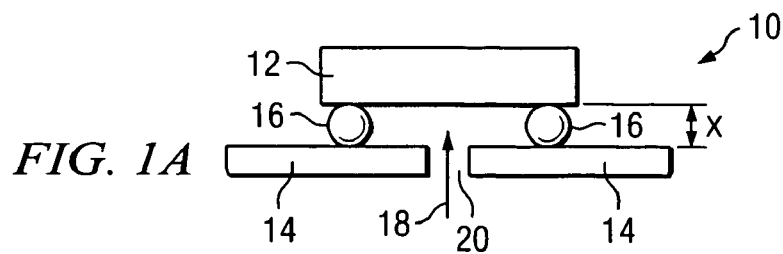
FIG. 1A is a cut-away side view of a portion of an IC assembly in an example of steps included in a preferred embodiment of the invention.

In general, the invention provides improved IC assemblies with a stand-off height greater than the starting solder bump height, and methods for their manufacture. Referring initially to FIG. 1A, steps in preferred methods of assembling a semiconductor device 10 according to the invention are depicted with a die 12 positioned in alignment with a substrate 14 having corresponding metallized solder connection points (not shown) familiar in the arts. Solder 16, typically accompanied by flux material known in the arts (not shown) is positioned in solid bumps prior to heating for the formation of solder connections between the die 12 and substrate 14. Those skilled in the arts will recognize that this is a common arrangement for the manufacture of IC assemblies and that the stand-off height, denominated X in FIG. 1A is equal to, or perhaps less than, but not greater than, the height of the solid solder 16 bump initially disposed between the die 12 and substrate 14.

According to the invention, provisions are made for the application of a lifting force, indicated by arrow 18, during the soldering process. In the embodiment shown in FIGS. 1A through 1C, the lifting force 18 is provided using an aperture 20 in the substrate 14 through which a lifting post or pin (not shown) may be inserted to contact the lower surface of the die 12 and provide lifting force 18 without disturbing the substrate 14. It is contemplated that the substrate 14 may be held in place with an opposing anchoring force as needed. It should be understood that although one aperture 20 is shown positioned at the approximate center of the die 12, various numbers and positions of apertures may be used without departure from the invention so long as a lifting force is provided during hardening as described and shown herein. For example, it is contemplated that a single aperture may be sufficient for a relatively small, square IC, and that more numerous, regularly spaced apertures 20 may be required for larger ICs or those with a more elongated footprint, as shown in the example of FIG. 5, in order to prevent tilting.

Figure 1B:
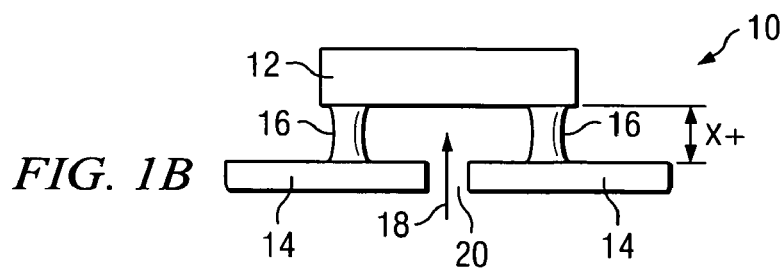
FIG. 1B is a cut-away side view of the portion of an IC assembly in the example of a FIG. 1A illustrating further steps in a preferred embodiment of the invention.
Figure 1C:
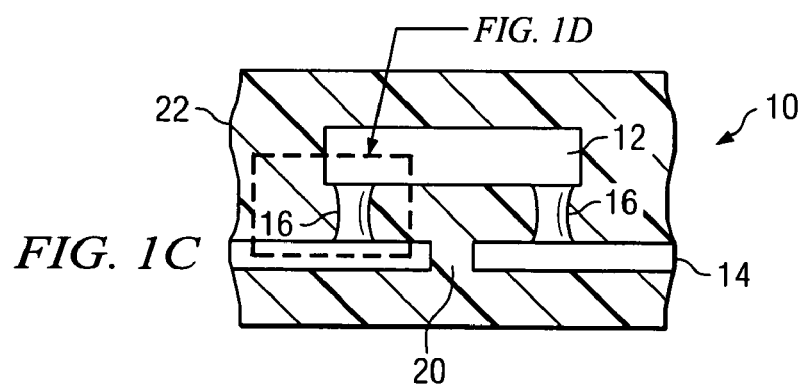
FIG. 1C is a cut-away side view of a portion of a completed IC assembly according to an example of a preferred embodiment of the invention.

Now referring primarily to FIG. 1B, the lifting force 18 is applied to the die 12 while the solder 16 is heated to a liquescent state. It should be understood that the solder 16 need not be completely melted, as long as it is sufficiently soft to elongate vertically while adhering to the attachment surfaces of the die 12 and substrate 14. Sufficient lifting force 18 is applied to increase the stand-off height of the die 12 above the substrate 14 to X+, elongating the solder 16 as shown in FIG. 1B. Thus, upon the cooling of the solder 16, returning it to a solid state, solder connections 16 with an increased stand-off height of X+ are formed between corresponding die 12 bond pads and substrate 14 bond pads. When the solder 16 becomes sufficiently rigid, the lifting force 18 is discontinued and the assembly 10 may then be encapsulated or underfilled as desired according to known techniques. A completed IC assembly 10 with encapsulant 22 encompassing the components and filling the aperture 20 is illustrated in FIG. 1C. FIG. 2 provides an alternative view showing the bottom of the IC assembly 10 of FIG. 1C according to the invention. The aperture 20 is filled with encapsulant 22 as part of the packaging process familiar in the arts. Those familiar with the arts will recognize that the increased stand-off height X+ is conducive to complete underfilling and also provides advantages in terms of reduced intrinsic stress.

Figure 1D:
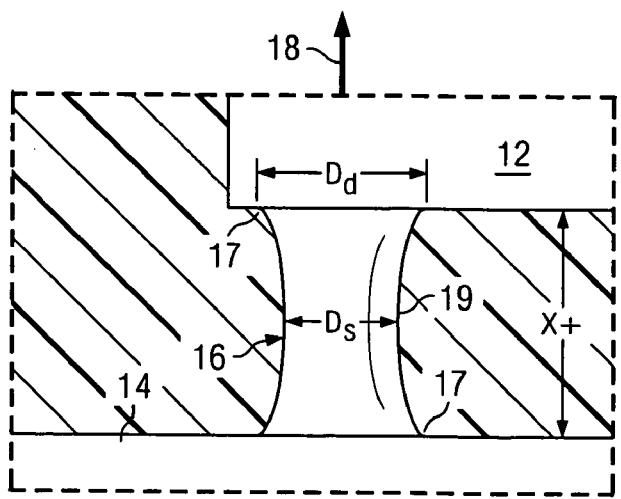
FIG. 1D is a close-up sectional view of an example of a solder bump of as shown in the example of FIG. 1B and FIG. 1C.

FIG. 1D is a close-up representation of a solder bump 16 of FIGS. 1B and 1C. Upon reflow, the solder bump 16 adheres to the die 12 and substrate 14 by surface tension indicated by the wider portions 17 represented by dimension Dd. Due to the elongation to stand-off height X+ caused by the application of upward force 18, the solder 16 becomes thinner in the center portion 19, represented by dimension Ds. Relating the dimensions in the presently preferred embodiment of the invention, it is preferred that X+ is maximized such that, 1.2*Dd >Ds >0.7*Dd. Of course, other relationships may be used in alternative embodiments of the invention, such as where it is desirable maintain a particular dimension, e.g., Ds, Dd, or X+, at a particular value or within a range of selected values.

It should be appreciated by those skilled in the arts that the steps may be performed in many alternative methods embodying the invention. For example, the solder 16 may be heated and permitted to harden in a configuration exemplified in FIG. 1A, and subsequently reheated until sufficiently liquefied during the application of the lifting force as shown in FIG. 1B. Alternatively, the lifting force 18 and reflow heating may be applied during a single operation in a suitably adapted reflow process. An example of an additional alternative embodiment of the invention is shown in FIG. 3, in which the lifting force 18 is applied using a lifter 24 such as a suction cup on the upper surface of the die 12, and in which an aperture in the substrate 14 is not required.

An alternative view of the steps in the method of the invention is provided in the process flow diagram of FIG. 4. The substrate, semiconductor die, and solder components are positioned and aligned 40 for soldering as known in the arts. Heat is applied 42 in order to cause the solder to become sufficiently liquefied to flow. A lifting force 18 is applied to increase the stand-off height while contact is maintained between the die, liquescent solder, and substrate. The solder is permitted to cool 44 to a solid state forming rigid bonds between the corresponding die bond pads, solder, and substrate bond pads. Final assembly steps 48 may be performed as known in the arts such as underfilling and encapsulating to complete the semiconductor device. It should be noted that underfillablity may be advantageously enhanced using the invention due to the increase in stand-off height, and that various underfill dispensing techniques may be used in combination with the invention, including edge dispensing as known in the arts.

The methods and apparatus of the invention provide advantages including but not limited to promoting electrical and mechanical bonding in IC assemblies. While the invention has been described with reference to certain illustrative embodiments, those described herein are not intended to be construed in a limiting sense. For example, rotating the orientation of the processes and techniques shown and described herein by 90 or 180 degrees with suitable modifications, the lifting force becomes a sideways-pressing or downward-pressing force respectively, separating the die and substrate to increase stand-off height and encompassed by the "lifting force" of the invention. It will be appreciated by those skilled in the arts that the invention may be used with various types of semiconductor device packages. Various modifications and combinations of the illustrative embodiments as well as other advantages and embodiments of the invention will be apparent to persons skilled in the arts upon reference to the drawings, description, and claims.

We claim:

1. A method of assembling a semiconductor device comprising the steps of:

providing a substrate having solder pads and an aperture;

placing a semiconductor die in a position for attachment to the substrate, covering the aperture, the semiconductor die having bond pads for making solder connections to corresponding solder pads of the substrate;

interposing solder between corresponding substrate and die solder pads, thereby forming a stand-off height of the die above the substrate;

heating the solder to a liquescent state;

applying a lifting force to the die through the aperture, thereby increasing the stand-off height of the die above the substrate;

cooling the solder to a solid state, thereby forming increased stand-off height solder connections between corresponding die bond pads and substrate bond pads;

removing the lifting force from the die; and performing finishing steps for completing the semiconductor device.

2. A method of assembling a semiconductor device according to claim 1 wherein the step of applying a lifting force to the die further comprises the step of pushing up on the die from below the aperture with a pin.

3. A method of assembling a semiconductor device according to claim 1 wherein the step of applying a lifting force to the die further comprises applying an opposing force to the substrate.

4. A method of assembling a semiconductor device according to claim 1 wherein the step of performing finishing steps for completing the semiconductor device further comprises the dispensing of underfill material between the die and substrate.

5. A method of assembling a semiconductor device according to claim 1 wherein the step of performing finishing steps for completing the semiconductor device further comprises the encapsulation of the die and substrate.

6. A method of assembling a semiconductor device according to claim 1 wherein the increased stand-off height solder connections are maximized such that:

$$1.2*D_d > D_s > 0.7*D_d$$

where, $D_d$ is the widest dimension of the solder connection, and
$D_s$ is the narrowest dimension of the solder connection.

* * * * *